United States Patent
Jow et al.

(10) Patent No.: US 8,049,512 B2
(45) Date of Patent: Nov. 1, 2011

(54) CIRCUIT BOARD WITH EMBEDDED COMPONENTS AND MANUFACTURING AND MEASURING METHOD THEREOF

(75) Inventors: Uei-Ming Jow, Hsinchu (TW); Min-Lin Lee, Hsinchu (TW); Shinn-Juh Lai, Hsinchu (TW); Chin-Sun Shyu, Hsinchu (TW); Chang-Sheng Chen, Hsinchu County (TW); Ying-Jiunn Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1121 days.

(21) Appl. No.: 11/882,814

(22) Filed: Aug. 6, 2007

(65) Prior Publication Data
US 2008/0035371 A1    Feb. 14, 2008

(30) Foreign Application Priority Data
Aug. 9, 2006  (TW) .............................. 95129262 A

(51) Int. Cl.
*G01R 31/11*    (2006.01)

(52) U.S. Cl. .................. 324/533; 324/530; 324/540
(58) Field of Classification Search .......... 324/533–540
See application file for complete search history.

(56) References Cited

U.S. PATENT DOCUMENTS 6,867,597 B2 *  3/2005  Hauptner et al. ............. 324/533
7,199,307 B2 *  4/2007  McCormack et al. ........ 174/260

FOREIGN PATENT DOCUMENTS

TW          490563 B      6/2002
WO   WO-2004/086069 A1   10/2004

* cited by examiner

*Primary Examiner* — Tuan T Dinh
(74) *Attorney, Agent, or Firm* — Rabin & Berdo, P.C.

(57) ABSTRACT

A circuit board with embedded components includes a plurality of embedded components and at least one transmission line electrically connected to at least one of the embedded components and having a terminal circuit. Therefore, a measuring device is used to be electrically connected to the transmission line and send out a signal, so as to receive a corresponding reflected signal, and then, compare the received reflected signal with a signal pattern in the database to obtain an electrical parameter of the embedded component.

6 Claims, 10 Drawing Sheets

CIRCUIT BOARD WITH EMBEDDED COMPONENTS AND MANUFACTURING AND MEASURING METHOD THEREOF

CROSS-REFERENCE TO RELATED APPLICATIONS

This non-provisional application claims priority under 35 U.S.C. §119(a) on Patent Application No(s). 095129262 filed in Taiwan, R.O.C. on Aug. 9, 2006, the entire contents of which are hereby incorporated by reference.

BACKGROUND OF THE INVENTION

1. Field of the Invention

The present invention relates to a circuit board with embedded components and a manufacturing and measuring method thereof, and more particularly, to a method for measuring the electrical parameter of at least one of the embedded components at the same time.

2. Related Art

As the rapid development of the information electronic products and high requirements for the performance and speed in the market, many information electronic products have been developed towards a trend of digital high speed, and an analog high frequency. On the other hand, the consumer electronic products also tend to meet the requirements of multifunction and being light, thin, short, small, especially for the portable electronic products of wireless communication, such as bluetooth, wireless LAN, cell phone. However, most of the hardware components of the above electronic product require a great number of passive components, which take over 75% of all the components of the system. Therefore, integrating the great number of passive components in the printed circuit board (PCB) to form embedded passives (or integral substrates) has a great market potential in increasing the density of the PCB.

The technique for the embedded passive component aims at integrating an embedded passive component and a surface mount type (SMD) into the circuit board. At least the following advantages can be achieved by integrating the embedded passive components into the circuit board. (1) The manufacturing cost is reduced. (2) The density of the circuit board is increased. Recently, the common PCB technique has gradually been used in a multi-layer printing structure, thus, the use of an original two-dimensional area is converted into a three-dimensional design, so as to reduce the volume of the product. (3) Welding points for the circuit are reduced, so as to enhance the reliability of the whole product. (4) The embedded component has a low humidity, which is protected from being corrosion.

The current technique for manufacturing embedded components includes the low temperature cofired ceramics (LTCC) process and the process for fabricating the functional substrate developed by Chinese Industrial Technology Research Institute, which greatly enhances the adaptability and the manufacturing stability of the embedded components.

Therefore, in the conventional art, an important impedance control line is provided in a high frequency electronic system for measuring the circuit board with the embedded component, i.e., an impedance control line is fabricated on the edge of the circuit board to measure the process variances of the line width, material parameter, and laminating thickness after being fabricated, and thereby observing whether the impedance of the transmission line is affected or not, and further affecting the transmission efficiency of the system, but the electrical parameter of the fabricated embedded component cannot be accurately measured. Alternatively, through a circuit design method, the mechanism of making the transmission line to be an open circuit, short circuit, or break circuit is provided, which can only measure whether the basic transmission line is communicated or not, thus being limited in function.

Moreover, in the conventional art, the measurement of the embedded components is carried on by taking a single embedded component for a single part measurement, i.e., the electrical parameter of only one embedded component can be measured at one time. Therefore, the conventional measuring method is time and labor consuming, thus the fabricating cost is increased and the production capability is reduced.

SUMMARY OF THE INVENTION

The present invention provides a method for rapidly measuring an electrical parameter of embedded components in a circuit board having the embedded components, thereby solving the problems encountered during the embedded component process in the prior art that considerable time is consumed in measuring correct electrical parameter of the embedded components, only one component can be measure at one time, which is time consuming and labor consuming.

The present invention discloses a circuit board having embedded components, which comprises a plurality of embedded components and at least one transmission line that is electrically connected to at least one of the embedded components and has a terminal circuit, so as to form an electrical loop.

When the electrical parameter of the embedded components is to be measured, a measuring device is provided to be electrically connected to the above transmission line and send out a continuous signal to the transmission line and to the plurality of embedded components connected by the transmission line, and then receive a reflected signal. Then, a database is provided, which has a plurality of signal patterns and a plurality of component electrical parameters corresponding to the signal patterns. Then, the received reflected signal is compared with the plurality of signal patterns in the database, and when the reflected signal matches with one of the plurality of signal patterns, the component electrical parameter corresponding to the matched signal pattern is returned.

The above database is established by measuring an embedded component with a known electrical parameter. Particularly, each embedded component is set as dependent variable or pre-determined variable, and by sequentially altering the dependent variable, different corresponding signal patterns used for being compared during the measurement are obtained.

Moreover, the present invention further discloses a circuit board having embedded components, which comprises a circuit region and a component measurement region. The circuit region has a plurality of embedded components and a circuit used for connecting the embedded components. The component measurement region is provided with a plurality of mapping components with the same structure as the plurality of embedded components, and at least one transmission line electrically connected to at least one of the mapping-components.

When the circuit board is measured, a measuring device is firstly provided to be electrically connected to the above transmission line and send a continuous signal to the transmission line and the plurality of embedded components connected by the transmission line, and then receive a reflected signal. Then, a database is provided, which has a plurality of signal patterns and a plurality of component electrical parameters corresponding to the signal patterns. Then, the received reflected signal is compared with the plurality of signal patterns in the database, and when the reflected signal matches with one of the plurality of signal patterns, the component electrical parameter corresponding to the matched signal pattern is returned.

The efficacy of the present invention is to provide a method for measuring a plurality of mapping components at the same time to determine the individual electrical parameter, so as to greatly shorten the time spent on measuring the embedded components in the process, enhance the manufacturing efficiency, reduce the increased manufacturing cost due to the consumption of time and labor, and also increase the accuracy of measuring the embedded component.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Both the foregoing general description and the following detailed description are intended to demonstrate and explain the principle of the present invention, and provide further explanation of the invention as claimed.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

In order to make the aforementioned and other objectives, features, and advantages of the present invention be more comprehensible, preferred embodiments accompanied with figures are described in detail below.

Figure 1:
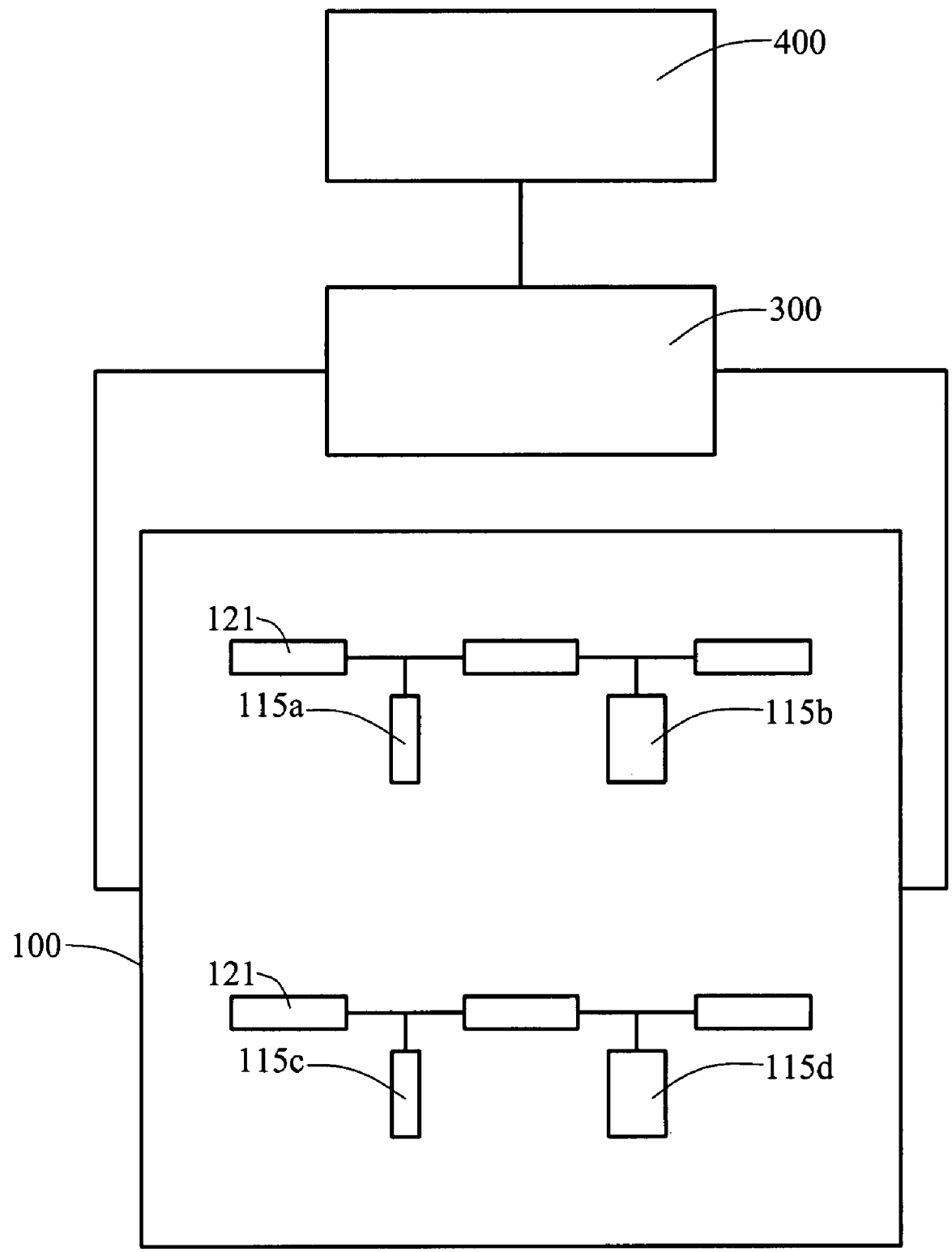
FIG. 1 is a schematic view of a first embodiment of the present invention.
Figure 4A:
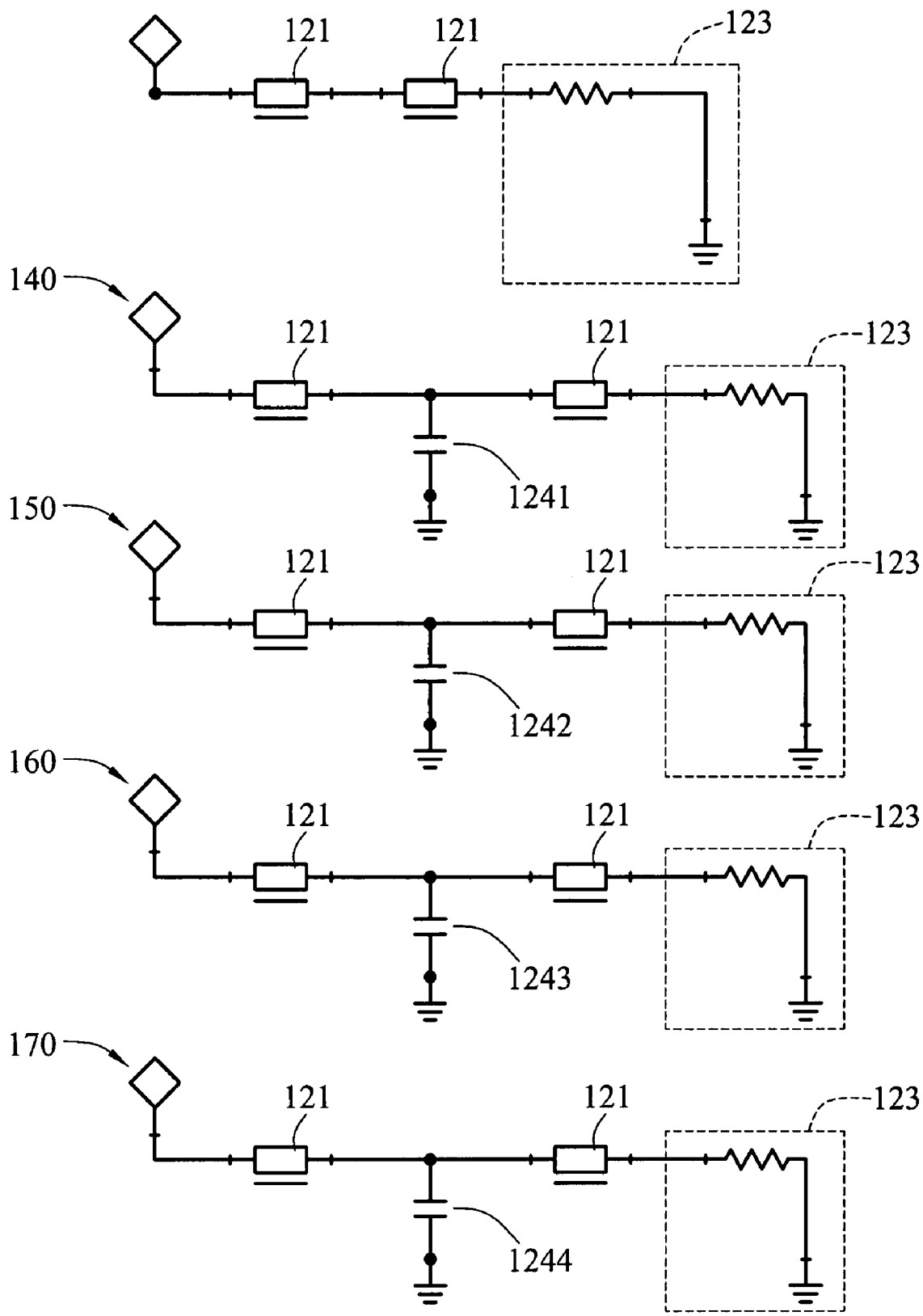
FIG. 4A is a schematic assembly view of the single capacitor circuit.

Please refer to FIG. 1 of a schematic view of a first embodiment of the present invention. As shown in FIG. 1, the first embodiment of the present invention provides a circuit board 100 electrically connected to a measuring device, and the measuring device used in the present invention is a time domain reflectometer (TDR) 300, which is connected to a database 400. The circuit board 100 has a plurality of embedded components such as a first embedded component 115a, a second embedded component 115b, a third embedded component 115c, and a fourth embedded component 115d connected by a plurality of transmission lines 121. Each of the transmission lines at least electrically connects more than one embedded component, and the transmission line 121 has a terminal circuit for transmission line 123, so as to form an electrical loop, as shown in FIG. 4A. The terminal circuit of transmission line 123 has a resistor or an embedded component electrically connected between the transmission line 121 and the ground, so as to form a preferred electrical loop. Moreover, the terminal circuit of transmission line 123 is also set as an open circuit, or the transmission line 121 is directly grounded.

Figure 3A:
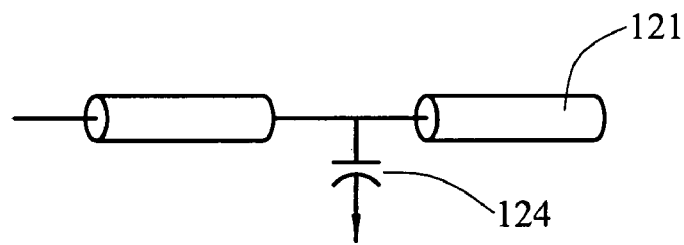
FIG. 3A is a schematic view of an embedded single capacitor circuit of the present invention.
Figure 3B:
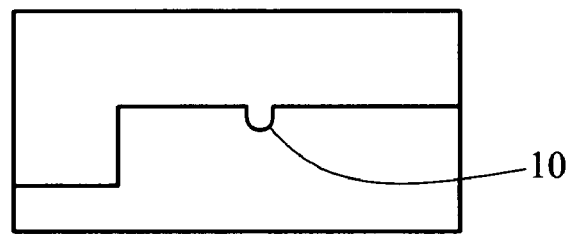
FIG. 3B is a curve diagram corresponding to the embedded single capacitor circuit in FIG. 3A.
Figure 3C:
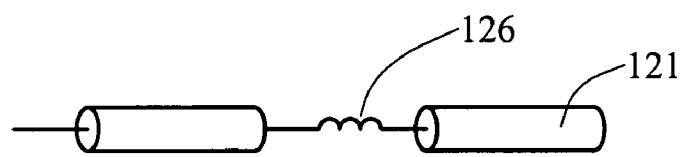
FIG. 3C is a schematic view of an embedded single inductor circuit of the present invention.
Figure 3D:
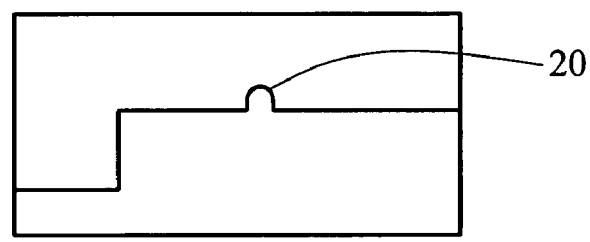
FIG. 3D is a curve diagram corresponding to the embedded single inductor circuit in FIG. 3C.

As shown in FIG. 3A, a plurality of transmission lines 121 is connected to an embedded capacitor 124, and the plurality of transmission lines 121 is not limited to have the same impedance, which may have different impedances. The above circuit is connected to the TDR 300, so that an electromagnetic wave signal is transferred by the TDR 300 into the transmission line 121 and the embedded capacitor 124, and a reflected signal is received, so as to obtain a pattern as shown in FIG. 3B, wherein the U-shaped recess 10 is a reaction curve corresponding to the embedded capacitor 124. As shown in FIG. 3C, a plurality of transmission lines 121 are connected to an embedded inductor 126, and then, the circuit is connected to the TDR 300, so that an electromagnetic wave signal is transferred by the TDR 300 into the transmission line 121 and the embedded inductor 126, and a reflected signal is received, so as to obtain a pattern as shown in FIG. 3D, wherein the U-shaped protrusion 20 is a reaction curve corresponding to the embedded inductor 126. Different reaction curves are generated corresponding to different embedded components.

Figure 4B:
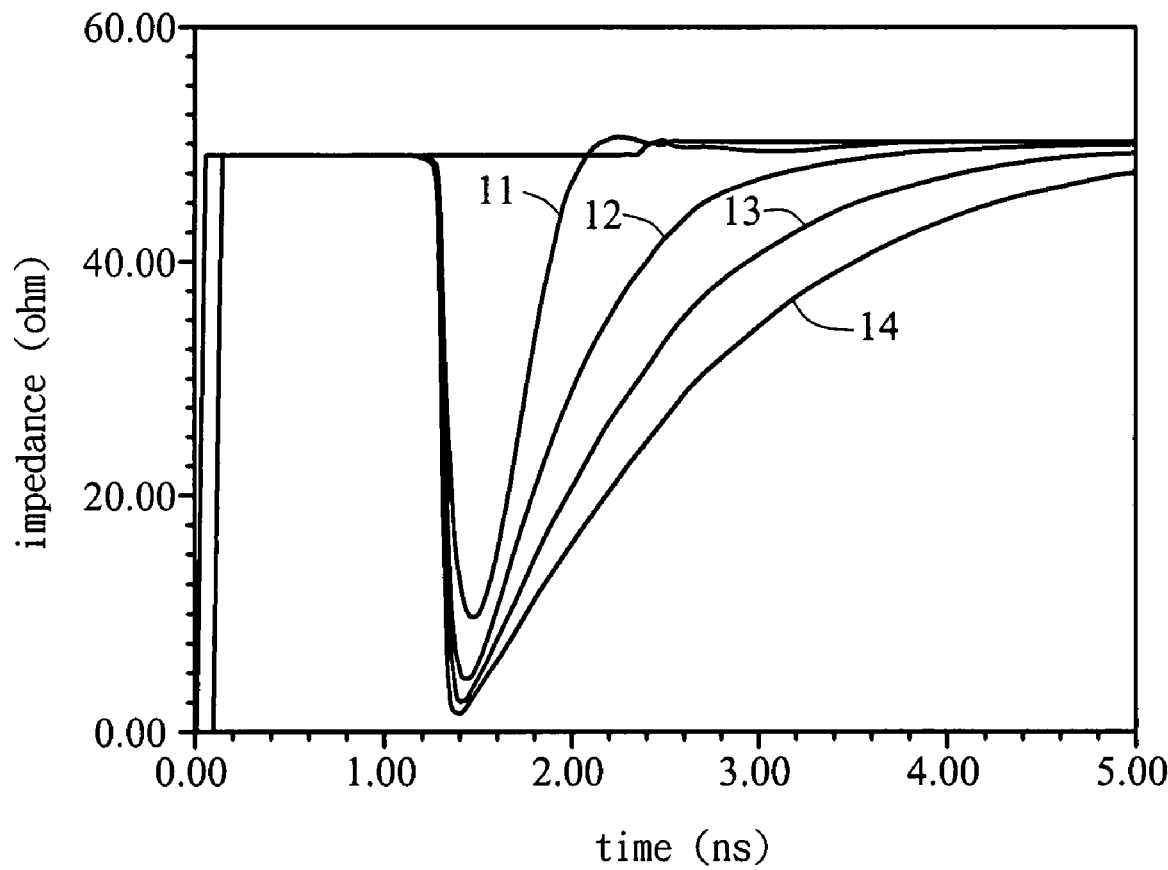
FIG. 4B is a curve diagram corresponding to the embedded single capacitor circuit assembly in FIG. 4A, which is a time-impedance relationship curve.

When connecting to capacitors with different capacitances, reaction curves are different corresponding to different reflected signals, wherein the reflected signal is also presented as a numerical curve. As shown in FIG. 4A, it shows an assembly of electrically connecting a transmission line 121 to a single embedded capacitor. A single capacitor circuit 140 includes the transmission line 121 connected to an embedded capacitor 1241 with a capacitance of 10 pF, and then, the circuit is connected to the TDR 300, which transfers an electromagnetic wave signal into the single capacitor circuit 140, and receives a reflected signal as a numerical curve 11, as shown in FIG. 4B. Therefore, the numerical curve 11 is a numerical curve corresponding to the embedded capacitor 1241 of 10 pF in the single capacitor circuit 140. Likewise, when a single capacitor circuit 150 including the transmission line 121 connected to an embedded capacitor 1242 with a capacitance of 20 pF is connected to the TDR 300, a corresponding numerical curve 12 is obtained. When a single capacitor circuit 160 including the transmission line 121 and an embedded capacitor 1243 with a capacitance of 30 pF is connected to the TDR 300, a corresponding numerical curve 13 is obtained. Finally, when a single capacitor circuit 170 including the transmission line 121 and an embedded capacitor 1244 with a capacitance of 40 pF is connected to the TDR 300, a corresponding numerical curve 14 is obtained. Therefore, the capacitance of an unknown capacitor can be correctly determined with reference to the shown numerical curves.

Figure 5A:
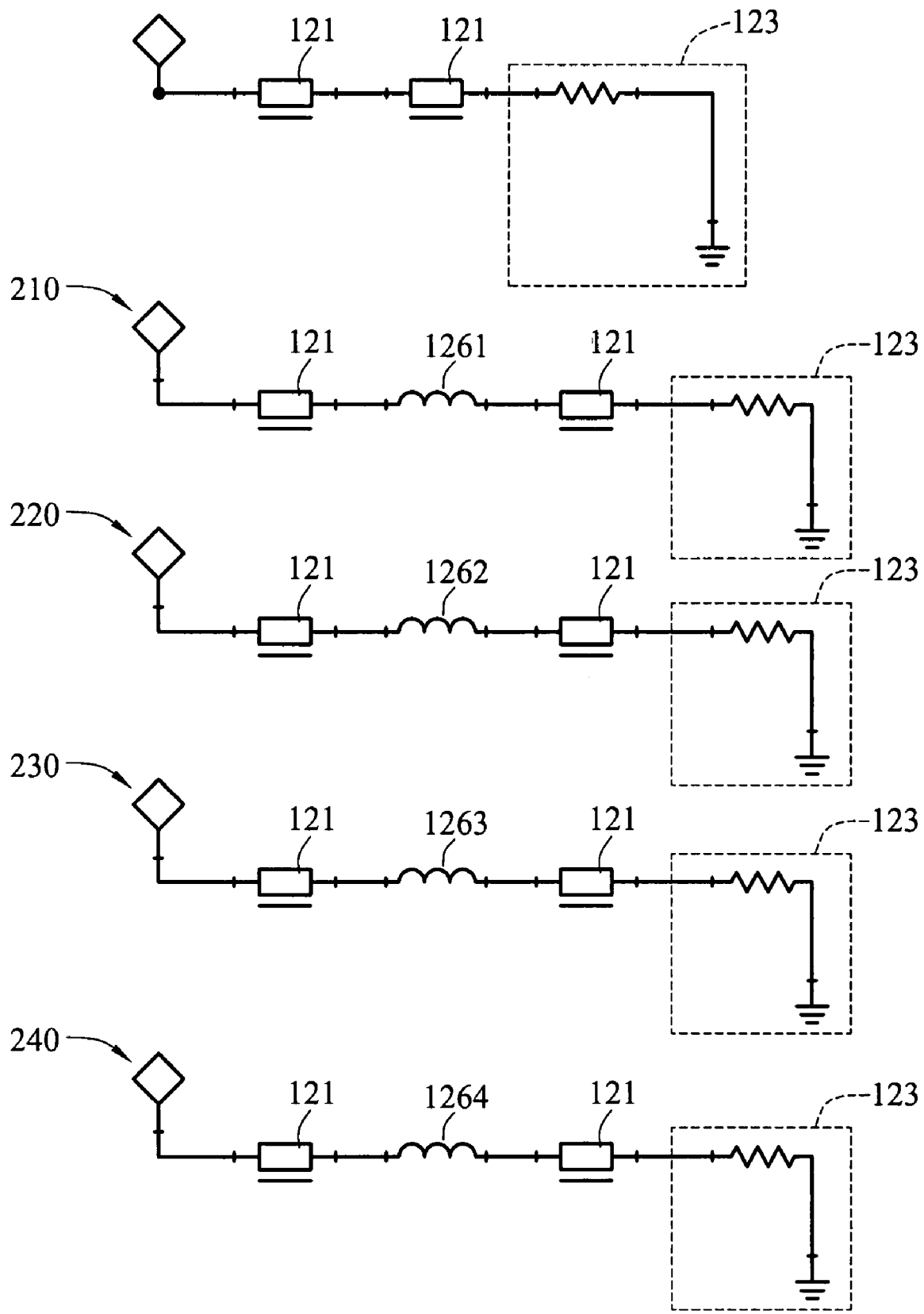
FIG. 5A is a schematic assembly view of the single inductor circuit.
Figure 5B:
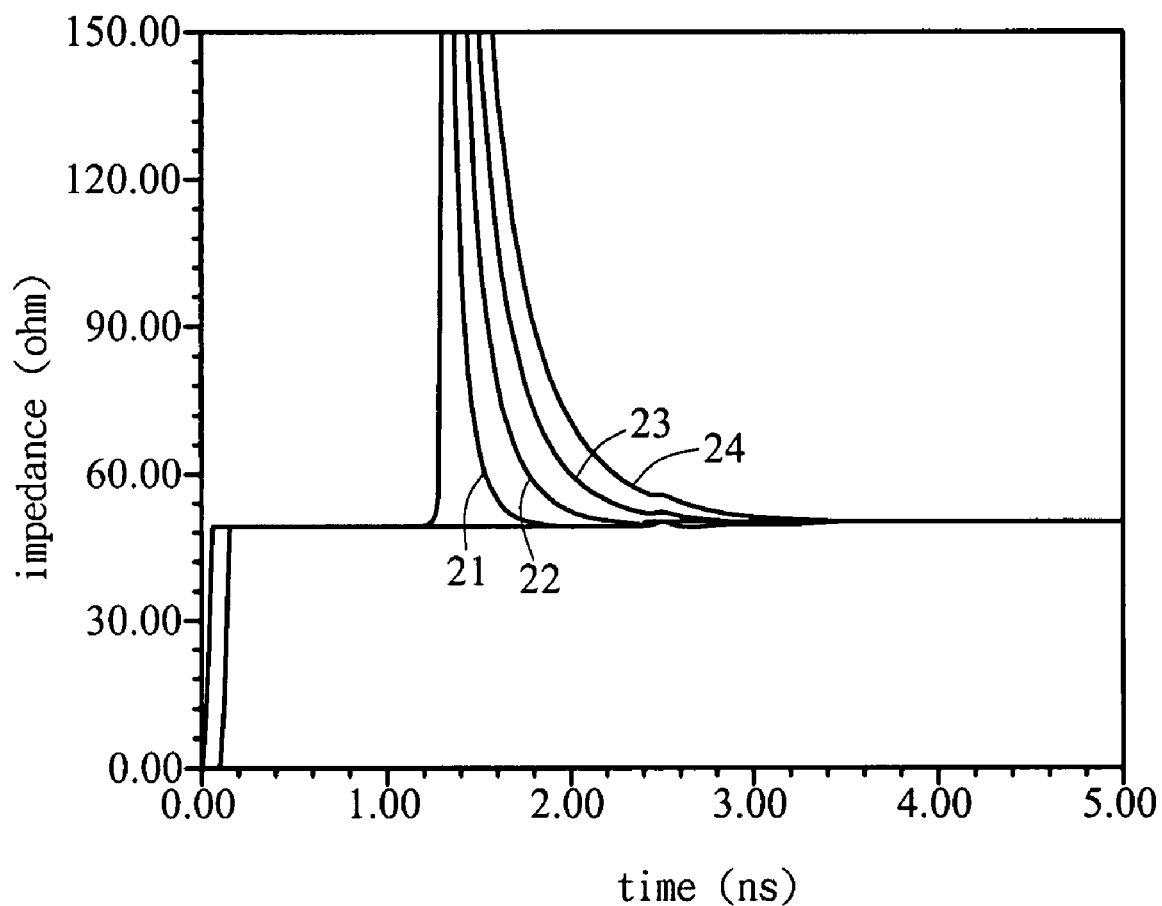
FIG. 5B is a curve diagram corresponding to the embedded single inductor circuit assembly in FIG. 5A, which is a time-impedance relationship curve.

When connecting to inductors with different inductances, numerical curves are different corresponding to different reflected signals. As shown in FIG. 5A, it shows an assembly of electrically connecting a transmission line 121 to a single embedded inductor used in the circuit board 100 having embedded components. A single inductor circuit 210 includes the transmission line 121 connected to an embedded inductor 1261 with an inductance of 10 nH, and then, the circuit is connected to the TDR 300, which transfers an electromagnetic wave signal into the single inductor circuit 210, and receives a reflected signal, so as to obtain a numerical curve 21, as shown in FIG. 5B. Therefore, the numerical curve 21 is a numerical curve corresponding to the embedded inductor 1261 of 10 nH in the single inductor circuit 210. Likewise, when a single inductor circuit 220 including a transmission line 121 connected to an embedded inductor 1262 with an inductance of 20 nH is connected to the TDR 300, a corresponding numerical curve 22 is obtained. When a single inductor circuit 230 including a transmission line 121 connected to an embedded inductor 1263 with an inductance of 30 nH is connected to the TDR 300, a corresponding numerical curve 23 is obtained. Finally, when a single inductor circuit 240 including the transmission line 121 connected to an embedded inductor 1264 with an inductance of 40 nH is connected to the TDR 300, a corresponding numerical curve 24 is obtained. Therefore, the inductance of an unknown inductor can be correctly determined with reference to the shown numerical curves.

As described above, the resistance of the transmission line 121 in the connected circuit and whether the unknown embedded component is a capacitor or an inductor can be effectively determined through the reflected signal (i.e., a numerical curve) shown by the TDR 300. Since the electrical parameter of the embedded component is corresponding to the numerical curve one by one, the electrical parameter of an unknown mapping component can be effectively and accurately determined.

Figure 6:
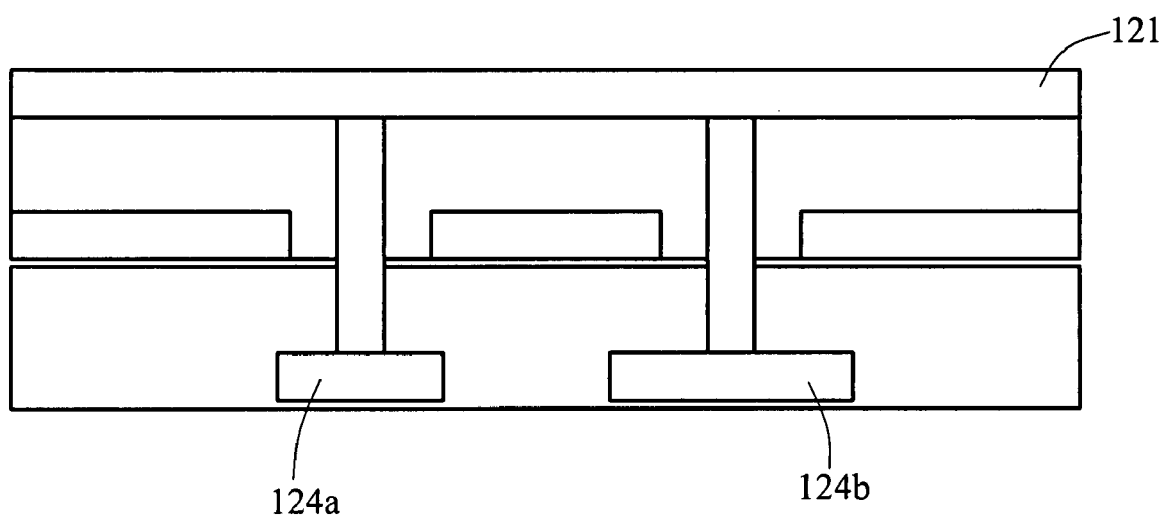
FIG. 6 is a partial schematic view of the present invention.

The above technique not only can be used in the measurement of a single embedded component, but also can be used in the measurement of a circuit having a plurality of embedded components. Referring to FIG. 6, it is partially schematic view of the present invention, wherein one circuit has a plurality of transmission lines 121 and two embedded components, that is, a first embedded capacitor 124a and a second capacitor 124b connected in series. The implementing method of the present invention is not limited to being connected in series, but also be implemented by being connected in parallel. The present invention further provides a method for measuring two embedded components at the same time, so as to save the time spent on measuring whether the embedded component is normal or not during the fabricating process.

Figure 7A:
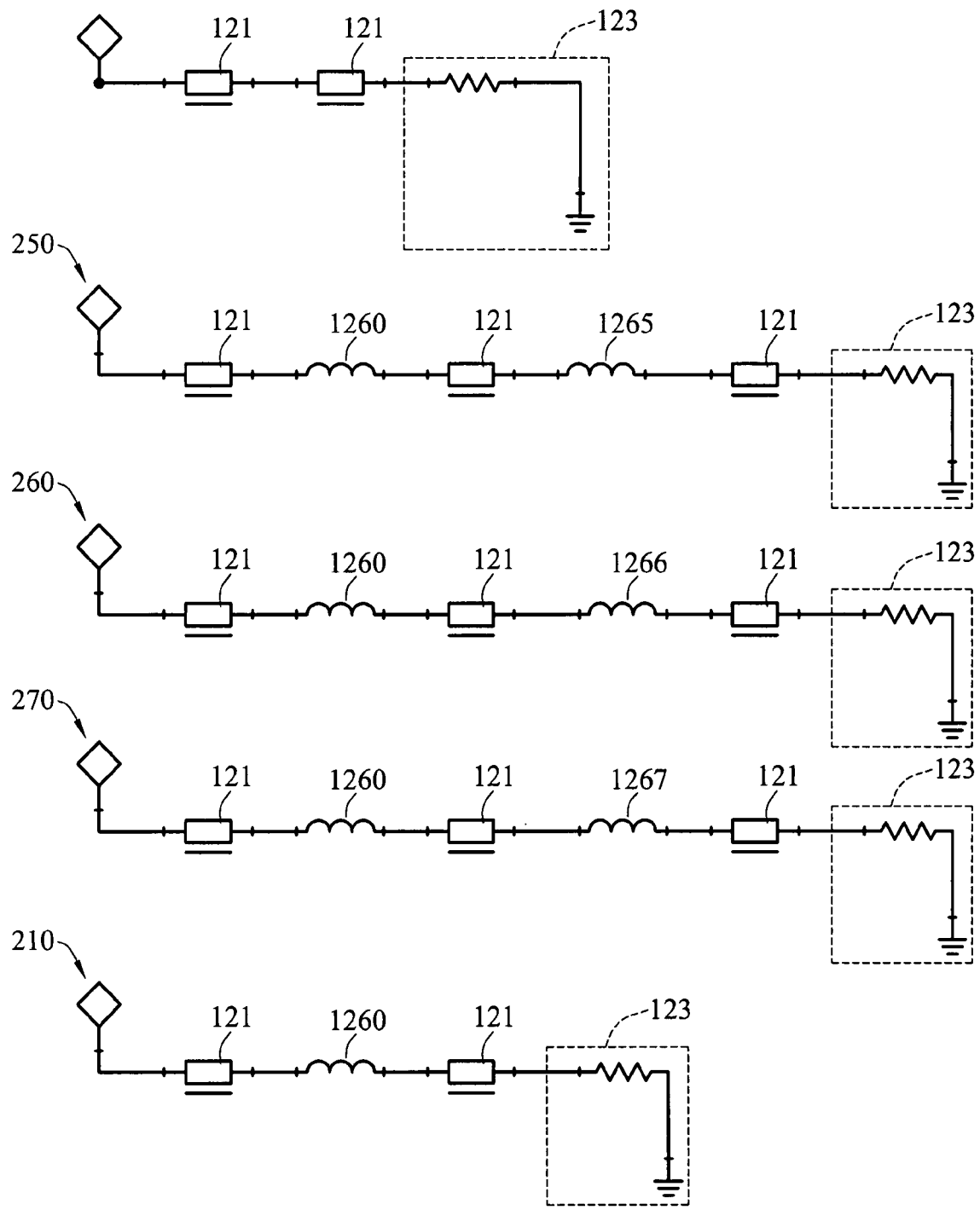
FIG. 7A is a schematic assembly view of a circuit with two serially-connected inductors.
Figure 7B:
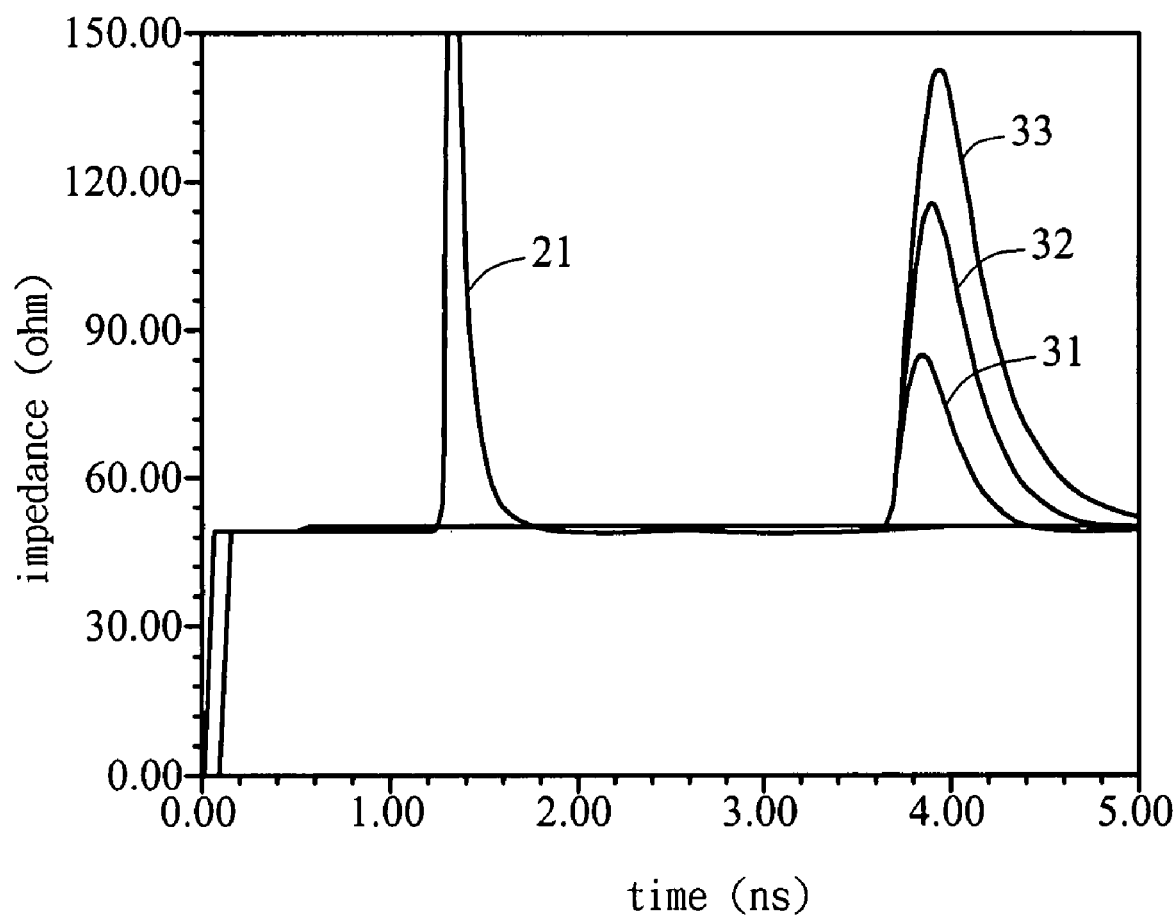
FIG. 7B is a curve diagram corresponding to the assembly of the circuit with two serially-connected inductors in FIG. 7A, which is a time-impedance relationship curve.

Therefore, referring to FIGS. 7A and 7B, they show a method for implementing a rapid measurement function of the present invention. As shown in FIG. 7A, it shows an assembly of electrically connecting a transmission line 121 to two embedded inductors used in the circuit board 100 having embedded components. An inductor series circuit 250 includes the transmission line 121 connected to a first embedded inductor 1260 and a second embedded inductor 1265 both with the inductance of 10 nH, and then, the circuit is connected to the TDR 300, which transfers an electromagnetic wave signal into the inductor series circuit 250, and receives a reflected signal, so as to obtain numerical curves 21 and 31, as shown in FIG. 7B. The numerical curve 21 is a numerical curve corresponding to the first embedded inductor 1260 in the inductor series circuit 250, and the numerical curve 31 is a numerical curve corresponding to the second embedded inductor 1265 in the inductor series circuit 250. Likewise, when a circuit 260 including a transmission line 121 connected to a first embedded inductor 1260 with an inductance of 10 nH and a second embedded inductor 1266 with an inductance of 20 nH is connected to the TDR 300, corresponding numerical curves 21 and 32 are obtained. The numerical curve 21 is a numerical curve corresponding to the first embedded inductor 1260 in the circuit 260, and the numerical curve 32 is a numerical curve corresponding to the second embedded inductor 1266 with an inductance of 20 nH in the inductor series circuit 260. Finally, when an inductor series circuit 270 including a transmission line 121 connected to a first embedded inductor 1260 with an inductance of 10 nH and a second embedded inductor 1267 with an inductance of 30 nH is connected to the TDR 300, corresponding numerical curves 21 and 33 are obtained. The numerical curve 21 is a numerical curve corresponding to the first embedded inductor 1260 in the inductor series circuit 270, and the numerical curve 33 is a numerical curve corresponding to the second embedded inductor 1267 with an inductance of 30 nH in the inductor series circuit 270. Therefore, the present invention can measure and read the numerical curves corresponding to more than two embedded inductors 126 at one time.

Then, referring to FIGS. 6, 7A, and 7B, the inductor series circuit 250 includes a first embedded inductor 1260 and a second embedded inductor 1265 both with the same inductance of 10 nH, and the corresponding numerical curves are 21 and 31 with different heights and widths. As shown in FIG. 1, when more than two embedded components are connected in the circuit, the electromagnetic wave signal received by the second embedded component 115b from the TDR 300 and the electromagnetic wave signal reflected back to the TDR 300 are definitely affected by the first embedded component 115a, so that numerical curves corresponding to the first embedded component 115a and the second embedded component 115b having the same electrical parameter are different. The numerical curve corresponding to the second embedded component 115b changes along with the electrical parameter of the first embedded component 115a.

Therefore, the method for establishing the database 400 for measuring more than two embedded components at one time provided by the present invention includes the following steps.

(a) A plurality of first components with a known electrical parameter and a plurality of second components with a known electrical parameter are provided, wherein each of the first and second components is an inductor, a capacitor, or a resistor. In order to obtain the above first and second components with the known electrical parameter, the first and second components with an unknown electrical parameter are respectively connected to the TDR 300, and then, a reflected signal is obtained by the TDR 300 respectively, and the reflected signal is compared with the electrical parameter of the single embedded component in the database 400. (b) One of the plurality of first components and one of the plurality of second components are selected and they are connected by a transmission line in series or in parallel. A corresponding signal pattern is received by the TDR 300. Then, the corresponding signal pattern, the electrical parameter of the selected first component, and the electrical parameter of the selected second component are stored into the database 400. For example, a first mapping inductor 1260 with an inductance of 10 nH, and a second mapping inductor 1265 with an inductance of 10 nH are selected, and then, they are connected to form an inductor series circuit 250 shown in FIG. 7A, and then, a corresponding signal pattern is received by the TDR 300, such that the signal patterns 21 and 31 shown in FIG. 7B are obtained. Therefore, the selected first embedded inductor 1260 with an inductance of 10 nH, the selected second embedded inductor 1265 with an inductance of 10 nH, and the corresponding signal patterns 21 and 31 form a corresponding relationship among each other, which are stored into the database 400. (c) Another second component is selected from the plurality of second components to replace the previously selected second component. (d) Step (b) is repeated until each of the second components is selected and the corresponding signal patterns are received by the TDR 300. Therefore, the electrical parameter of the first component in Step (b), the electrical parameter of another second component in Step (c), and the corresponding signal patterns form a corresponding relationship, which are stored into the database 400. For example, a first embedded inductor 1260 with an inductance of 10 nH and a second embedded inductor 1266 with an inductance of 20 nH are selected, and they are connected to form the inductor series circuit 260, and then, a corresponding signal pattern is received by the TDR 300, so that the signal patterns 21 and 32 as shown in FIG. 7B are obtained. Therefore, the selected first embedded inductor 1260 with an inductance of 10 nH, the selected second embedded inductor 1266 with an inductance of 20 nH, and the corresponding signal patterns 21 and 32 form a corresponding relationship with each other, which are stored into the database 400. (e) Then, another first component is selected from the plurality of first components to replace the previously selected first component. (f) Steps (b), (c), and (d) are sequentially repeated until each of the second components is selected and the corresponding signal patterns are received by the measuring device. (g) Steps (e) and (f) are repeated until each of the first components is selected.

Therefore, when any circuit includes an unknown first embedded component 115a and an unknown second embedded component 115b, the first embedded component 115a is a capacitor, an inductor, or a resistor, and the second embedded component 115b is also a capacitor, an inductor, or a resistor. The circuit is connected to the TDR 300, and a reflected signal is obtained by the TDR 300, i.e., a first numerical curve and a second numerical curve are obtained. The reflected signal is compared with the plurality of signal patterns in the database 400, and when the reflected signal matches with one of the plurality of the signal patterns, the electrical parameter of each component corresponding to the matched signal pattern is returned, thus, the electrical parameters of the unknown first and second embedded components are obtained.

Figure 2:
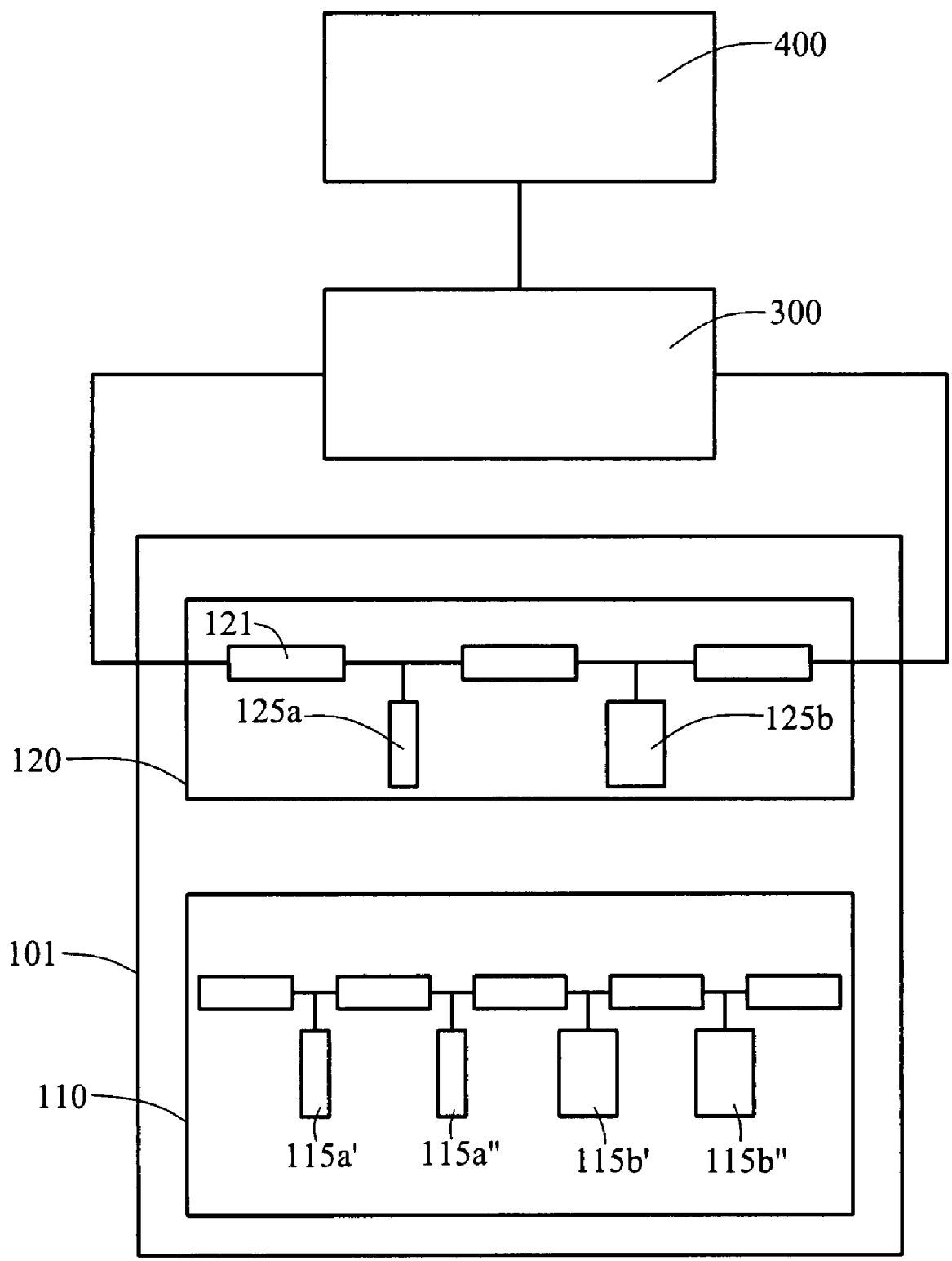
FIG. 2 is a schematic view of a second embodiment of the present invention.

Then, please refer to FIG. 2 of a schematic view of a second embodiment of the present invention. As shown in FIG. 2, the circuit board 101 of the present invention has a circuit region 110 and a component measurement region 120 electrically connected to a measuring device. The measuring device used in the present invention is a TDR 300 that is further connected to a database 400. The circuit region 110 has a plurality of embedded components, including, for example, a fifth embedded component 115a', a sixth embedded component 115a", a seventh embedded component 115b', an eighth embedded component 115b", and an application circuit used for connecting the plurality of embedded components. The component measurement region 120 has mapping components corresponding to the embedded components in the circuit region, for example, a first mapping component 125a and a second mapping component 125b. The circuit region 110 has more than two embedded components with the same structure, such as the first embedded component 115a' and the second embedded component 115a", thus, only one first mapping component 125a with the same structure is required to be disposed in the component measurement region 120, and more than one mapping components in the component measurement region 120 are electrically connected by the transmission line 121.

Other implementing methods, as shown in FIGS. 2 to 7B, are the same as the main implementing method of the first embodiment, with the main difference lying in that, in the second embodiment, the TDR 300 is used to measure the plurality of reflected signals for the plurality of mapping devices corresponding to the embedded components in the component measurement region 120 at one time, and to compare the plurality of reflected signals with the plurality of signal patterns in the database 400. The processes for comparison and returning the data are the same as that in the first embodiment.

The implementing method of the present invention is not limited to measuring two embedded components, but instead, more than two reflected signals (i.e., more than two numerical curves) obtained by the TDR 300 also can be received in the circuit having more than two embedded components and the obtained reflected signals are compared with the data in the database 400 to determine the electrical parameters of more than two mapping components in the circuit. Each of the mapping components may be a capacitor, an inductor, or a resistor.

The method for manufacturing a circuit board having embedded components and for measuring a mapping component provided in the present invention can be used in the process for fabricating a PCB, a low temperature cofired ceramics (LCTT) circuit board, or a circuit board in the thin film process, and a circuit board in the thick film process, which thus is a widely used manufacturing and measuring method.

The first and second embodiments of the present invention can solve the problems in the conventional art. In the process for fabricating the embedded component in the conventional art, in order to measure the correct electrical parameter of the embedded component, a corresponding mapping component is required to be fabricated in the component measurement region 120, and electrodes are required to be attached to both sides of one mapping component to measure the electrical parameter, and the electrical parameter of only one mapping component can be measured at one time. The present invention provides a method for rapidly measuring a plurality of embedded components at one time to determine the electrical parameters thereof, thus, the time spent on testing the embedded component is greatly reduced, the manufacturing efficiency is improved, and the increased manufacturing cost due to the consumption of time and labor is reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for measuring a circuit board having embedded components and at least one transmission line electrically connected to at least one of the embedded components and having a terminal circuit, so as to form an electrical loop, comprising:
   providing a measuring device electrically connected to the transmission line and sending out a signal to the transmission line and to the embedded components connected to the transmission line;

receiving a reflected signal;

providing a database having a plurality of signal patterns and a plurality of electrical parameters corresponding to the signal patterns; and comparing the reflected signals with the signal patterns, and if the reflected signal matches with one of the signal patterns, returning the electrical parameter of each component corresponding to the matched signal pattern.

2. The method for measuring the circuit board having embedded components as claimed in claim 1, wherein the step of providing a database comprises:

(a) providing a plurality of first components having a known electrical parameter and a plurality of second components having a known electrical parameter, wherein the first and second components comprise a plurality of components having the same electrical parameter as the embedded components;

(b) selecting one of the plurality of first components and one of the plurality of second components, and connecting the selected first component and the selected second component by a transmission line, and receiving a corresponding signal pattern by the measuring device, and then, storing the corresponding signal pattern, the electrical parameter of the selected first component, and the electrical parameter of the selected second component into the database;

(c) selecting another second component from the plurality of second components to replace the previously selected second component;

(d) repeating step (b) until each of the second components is selected and the corresponding signal patterns are received by the measuring device;

(e) selecting another first component from the plurality of first components to replace the previously selected first component;

(f) sequentially repeating Steps (b), (c) and (d) until each of the second components is selected and the corresponding signal patterns are received by the measuring device; and (g) repeating steps (e) and (f) until each of the first components is selected.

3. The method for measuring the circuit board having embedded components as claimed in claim 1, wherein the step of providing a measuring device includes providing a time domain reflectometer (TDR) as the measuring device.

4. The method for measuring the circuit board having embedded components as claimed in claim 2, wherein the step of connecting the first component to the second component by the transmission line is electrically connecting the first component to the second component in series via the transmission line.

5. The method for measuring the circuit board having embedded components as claimed in claim 2, wherein the step of connecting the first component to the second component by the transmission line is electrically connecting the first component to the second component in parallel via the transmission line.

6. The method for measuring the circuit board having embedded components as claimed in claim 2, wherein the first and second components having known electrical parameters are any one selected from a group consisting of a capacitor, an inductor, and a resistor.

* * * * *